(12) United States Patent
Liang

(10) Patent No.: US 10,778,164 B2
(45) Date of Patent: Sep. 15, 2020

(54) INPUT RECEIVER CIRCUIT AND ADAPTIVE FEEDBACK METHOD

(71) Applicant: Winbond Electronics Corp., Taichung (TW)

(72) Inventor: Chih-Wei Liang, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 133 days.

(21) Appl. No.: 16/153,324

(22) Filed: Oct. 5, 2018

(65) Prior Publication Data
US 2020/0112292 A1  Apr. 9, 2020

(51) Int. Cl.
| | | |
|---|---|---|
| H03F 3/45 | (2006.01) |
| H03K 19/21 | (2006.01) |
| H03K 5/135 | (2006.01) |
| G06F 1/10 | (2006.01) |
| H03K 3/027 | (2006.01) |
| H03K 5/00 | (2006.01) |
| H03F 1/52 | (2006.01) |

(52) U.S. Cl.
CPC ............ H03F 3/4521 (2013.01); G06F 1/10 (2013.01); H03K 3/027 (2013.01); H03K 5/135 (2013.01); H03K 19/21 (2013.01); *H03F 1/523* (2013.01); *H03F 2200/426* (2013.01); *H03K 2005/00215* (2013.01)

(58) Field of Classification Search
None
See application file for complete search history.

(56) References Cited

U.S. PATENT DOCUMENTS

| | | | |
|---|---|---|---|
| 5,117,124 A | 5/1992 | Dicke | |
| 5,497,126 A * | 3/1996 | Kosiec | H03L 3/00 327/156 |
| 5,606,320 A | 2/1997 | Kleks | |
| 7,535,396 B1 | 5/2009 | Melanson | |
| 7,564,314 B2 * | 7/2009 | Familia | H03L 7/18 331/16 |
| 8,827,166 B2 | 9/2014 | Kuroda | |
| 9,992,049 B1 * | 6/2018 | Novellini | H03L 7/07 |

(Continued)

OTHER PUBLICATIONS

Tiawan Patent Office. Office Action, application No. 10820235410. dated Mar. 15, 2019. 7 pages.

*Primary Examiner* — Cassandra F Cox
(74) *Attorney, Agent, or Firm* — Muncy, Geissler, Olds & Lowe, P.C.

(57) ABSTRACT

An adaptive feedback method for use in a memory device is provided. The memory device includes a first input-receiver circuit and a plurality of second input-receiver circuits. The method includes the steps of: providing a clock signal and an inverted clock signal to the first input-receiver circuit; generating an enable control signal by the first input-receiver circuit to control a first feedback path in the first input-receiver circuit; in response to the frequency of the clock signal and the inverted clock signal being higher than or equal to a predetermined frequency, activating the first feedback path in the first input-receiver circuit according to the enable control signal; and in response to the frequency of the clock signal and the inverted clock signal being lower than the predetermined frequency, deactivating the first feedback path in the first input-receiver circuit according to the enable control signal.

11 Claims, 7 Drawing Sheets

(56) References Cited

U.S. PATENT DOCUMENTS

| | | | |
|---|---|---|---|
| 10,573,272 B2* | 2/2020 | Mozak | H03L 1/02 |
| 2007/0097752 A1* | 5/2007 | Penney | G11C 11/4093 |
| | | | 365/189.05 |
| 2012/0086488 A1* | 4/2012 | Willey | H03K 5/1565 |
| | | | 327/175 |

* cited by examiner

INPUT RECEIVER CIRCUIT AND ADAPTIVE FEEDBACK METHOD

BACKGROUND OF THE INVENTION

Field of the Invention

The present invention relates to electronic circuits and, in particular, to an input-receiver circuit and an adaptive feedback method.

Description of the Related Art

With the advances being made in technology, the operating frequency of the computer memory currently available on the consumer market has become higher and higher. For example, a double-data-rate synchronous dynamic random access memory (DDR SDRAM) may be operated at an operating frequency of hundreds of MHzs or above. In addition, each of the input signals received by a memory device has a corresponding high-speed input receiver. However, when the high-speed input receiver is operated at a low-frequency clock rate or the slew rate of the clock signal is low, the output signal of the high-speed input receiver may have oscillation, and thus it is difficult for the backend circuits (e.g., a memory device) to correctly capture a corresponding command, address, and data signal, resulting in the memory device operating incorrectly or malfunctioning.

Accordingly, there is demand for an input-receiver circuit and an adaptive feedback method to solve the aforementioned problem.

BRIEF SUMMARY OF THE INVENTION

A detailed description is given in the following embodiments with reference to the accompanying drawings.

In an exemplary embodiment, an input-receiver circuit is provided. The input-receiver circuit includes: a first input receiver, a second input receiver, and a control-signal output stage. The first input receiver includes: a first differential amplifier, a first buffer circuit, and a first delay circuit. The first differential amplifier is configured to receive a clock signal and output an amplified clock signal. The first buffer circuit is configured to buffer the amplified clock signal and output an output clock signal, wherein there is a first feedback path between the first buffer circuit and the first differential amplifier. The first delay circuit is configured to add a time delay on the amplified clock signal to generate a first delayed signal. The second input receiver includes: a second differential amplifier, a second buffer circuit, and a second delay circuit. The second differential amplifier is configured to receive an inverted clock signal and output an amplified inverted clock signal. The second buffer circuit is configured to buffer the amplified inverted clock signal and output an output inverted clock signal, wherein there is a second feedback path between the second buffer circuit and the second differential amplifier. The second delay circuit is configured to add the time delay on the amplified inverted clock signal to generate a second delayed signal. The control-signal output stage is configured to generate an enable control signal according to the first delayed signal and the second delayed signal, wherein the enable control signal controls activation and deactivation of the first feedback path and the second feedback path.

In another exemplary embodiment, an adaptive feedback method for use in a memory device is provided. The memory device includes a first input-receiver circuit and a plurality of second input-receiver circuits. The method includes the steps of: providing a clock signal and an inverted clock signal to the first input-receiver circuit; generating an enable control signal by the first input-receiver circuit to control a first feedback path in the first input-receiver circuit; in response to a frequency of the clock signal and the inverted clock signal being higher than or equal to a predetermined frequency, activating the first feedback path in the first input-receiver circuit according to the enable control signal; and in response to the frequency of the clock signal and the inverted clock signal being lower than the predetermined frequency, deactivating the first feedback path in the first input-receiver circuit according to the enable control signal.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1A:
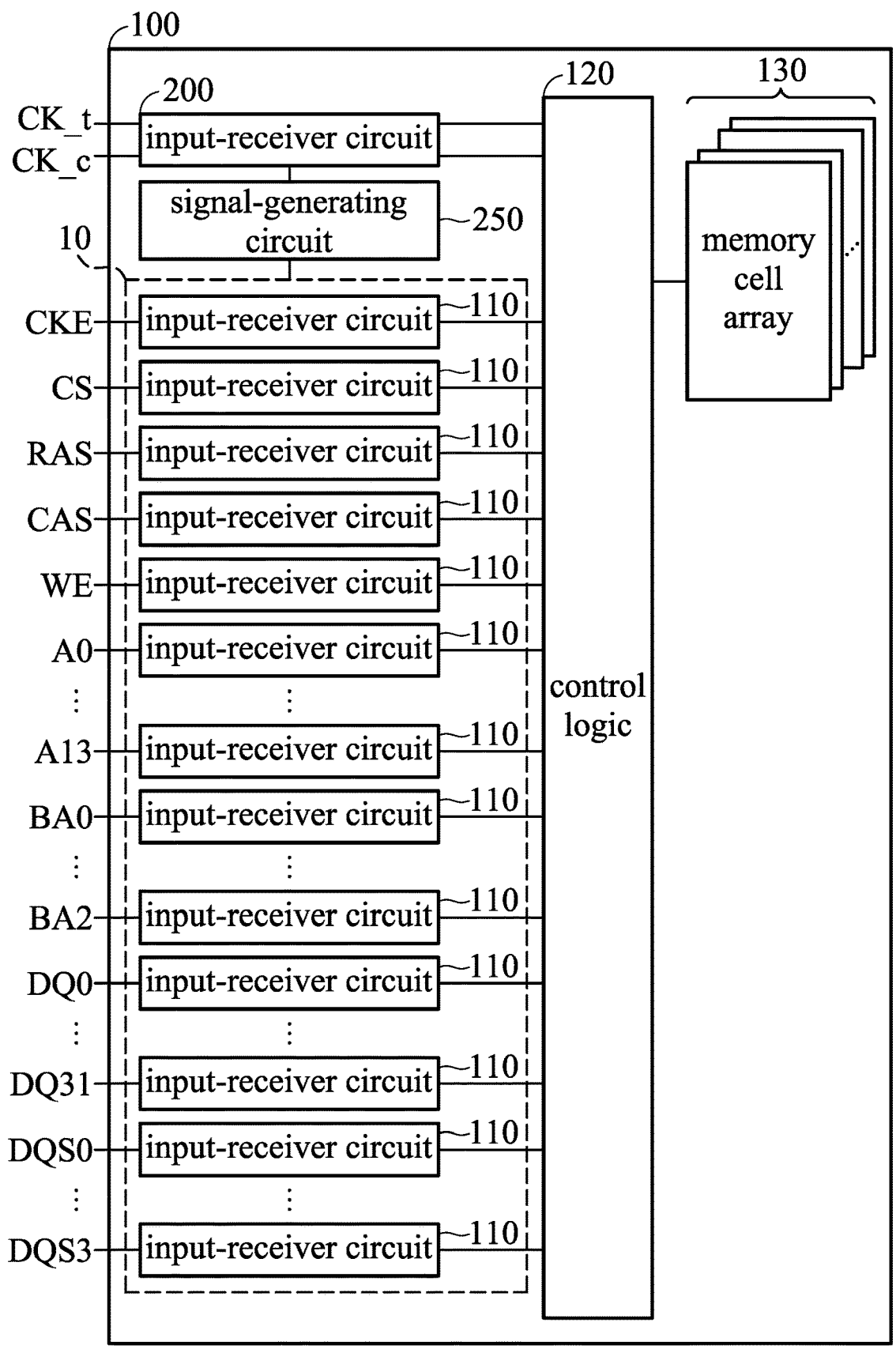
FIG. 1A is a diagram of a memory device in accordance with an embodiment of the invention.

FIG. 1A is a diagram of a memory device in accordance with an embodiment of the invention.

As depicted in FIG. 1A, the memory device 100 includes a plurality of input-receiver circuits 110, an input-receiver circuit 200, a control logic 120, and a plurality of memory-cell arrays 130.

In an embodiment, the memory device 100 receives a clock signal, a command signal, an address signal, and a data signal from a host (e.g., a central processing unit). The clock signal includes a clock signal CK_t, an inverted clock signal CK_c, and an clock enable signal CKE, wherein the clock signal CK_t and the inverted clock signal CK_c correspond to the input-receiver circuit 200.

The command signal, for example, includes a chip select (CS) signal, a row-address-strobe (RAS) signal, a column-address-strobe (CAS) signal, and a write enable (WE) signal. The address signal may include a command address A[13:0] and a bank address BA[2:0]. However, the sizes (i.e., number of bits) of the command address A and bank address BA can be adjusted according to practical conditions. The data signal, for example, includes a data signal DQ[31:0] and a data-strobe signal DQS[3:0], wherein the sizes of the data signal DQ and data-strobe signal DQS can be adjusted according to practical conditions. It should be noted that the present invention is not limited to the aforementioned sizes of the command signal, address signal, and data signal.

Specifically, in addition to the clock signal CK_t and the inverted clock signal CK_c, each bit of the aforementioned signals requires a corresponding input-receiver circuit 110 to adjust the voltage swing of the corresponding signal to an appropriate voltage swing for the memory device 100 for operations of subsequent circuits. The clock signal, for example, includes the clock signal CK_t and inverted clock signal CK_c that correspond to the input-receiver circuit 200. The input-receiver circuit 200 may control activation or deactivation of a feedback path in each of the input-receiver circuits 100 in range 10, and the details are described below.

The control logic 120 is configured to control the memory-cell arrays 130 according to the commands from the host. The memory-cell arrays 130, for example, may be dynamic random access memory (DRAM) cell arrays that can be divided into a plurality of memory banks.

Figure 1B:
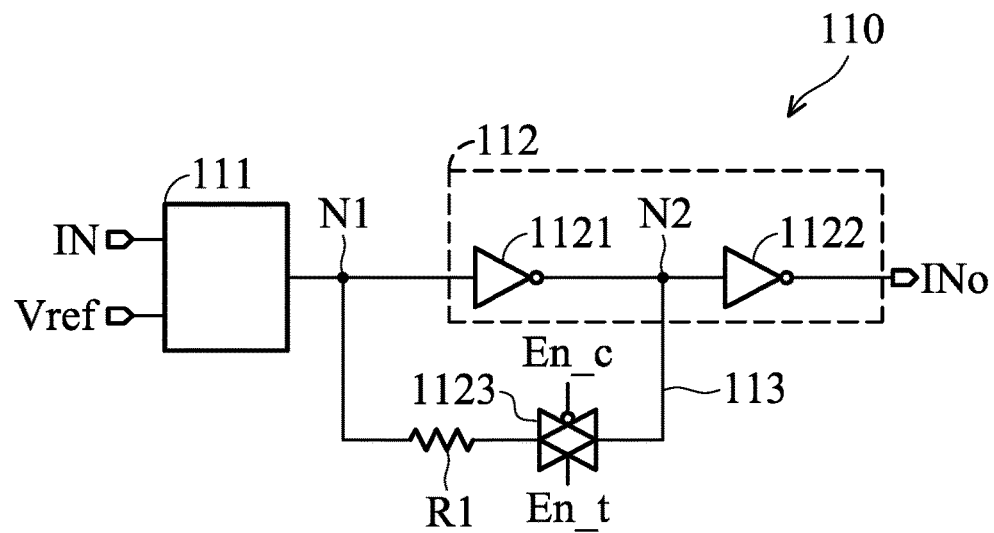
FIG. 1B is a diagram of an input-receiver circuit 110 in accordance with an embodiment of the invention.
Figure 1C:
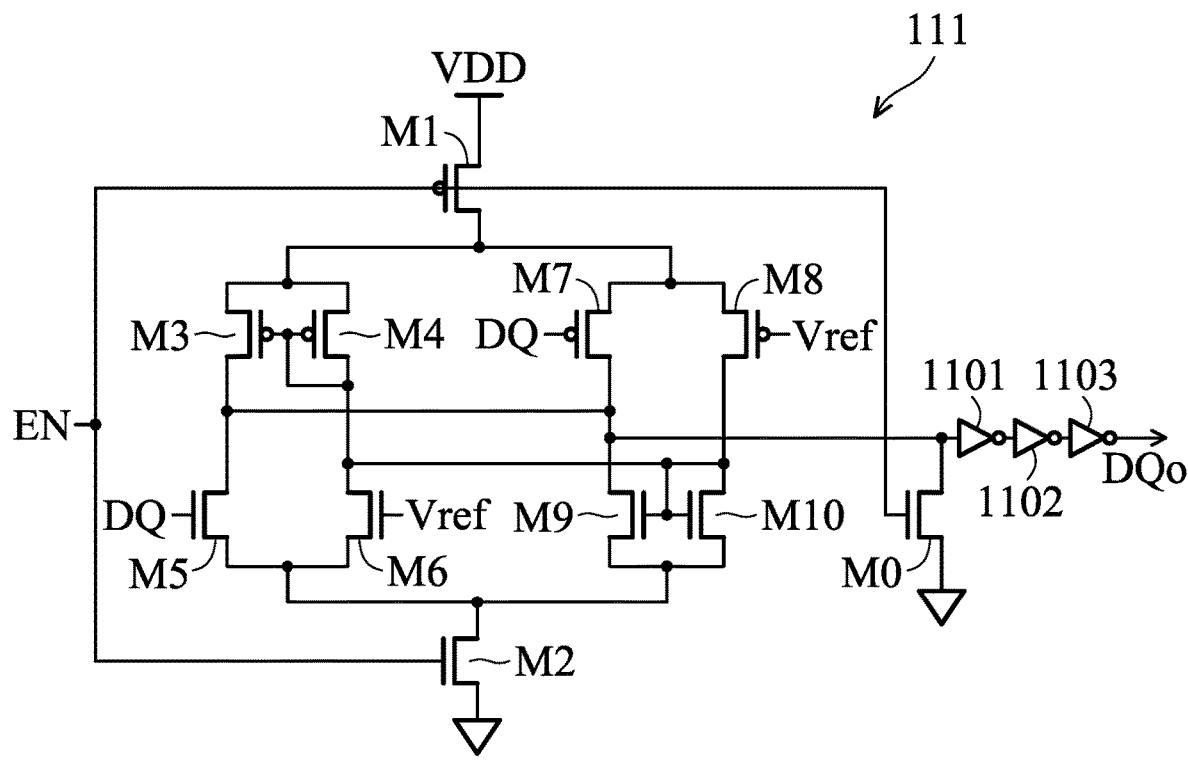
FIG. 1C is a diagram of a differential amplifier 111 in accordance with an embodiment of the invention.

FIG. 1B is a diagram of an input-receiver circuit 110 in accordance with an embodiment of the invention. FIG. 1C is a diagram of a differential amplifier 111 in accordance with an embodiment of the invention.

The input-receiver circuit 110 includes a differential amplifier 111 and a buffer circuit 112. The differential circuit 111 receives an input signal IN and a reference voltage Vref, and generates a first signal at an output terminal (e.g., node N1) of the differential amplifier 110. For example, the differential amplifier 110 may be a wide-swing differential amplifier, wherein the input signal IN may be one of the bits in the command signal, address signal, or data signal.

The differential amplifier 111 may be the differential amplifier circuit shown in FIG. 1C, and the differential amplifier 111 includes MOSFETs M0~M10 and inverters 110~1103, where the input signal DQ (e.g., input signal IN in FIG. 1B) of the differential signal 111 may be one of the bits in the command signal, address signal, or data signal, and the differential amplifier 111 generates an output signal DQo. The enable signal EN in FIG. 1C may be an inverted clock enable signal CKE_c. One having ordinary skill in the art will appreciate the details of the wide-swing differential amplifier, and thus the details will be omitted here.

The buffer circuit 112 includes inverters 1121 and 1122, as shown in FIG. 1B. For example, the first signal at node N1 is fed into the buffer circuit 112, and the first signal passes through the inverters 1121 and 1122 to generate the output INo at the output terminal of the buffer circuit 112. If the input signal IN of the input-receiver circuit 110 is the command signal CAS, the output signal generated by the input-receiver circuit 110 is CASo. If the input signal IN of the input-receiver circuit 110 is A[0] (or A0), the output signal generated by the input-receiver circuit 110 is Ao[0], and so forth.

It should be noted that there is a feedback path (e.g., or a feedback circuit) 113 between the differential amplifier 111 and the buffer circuit 112, wherein the feedback path 113 includes a tristate inverter 1123 and a resistor R1.

For example, a second signal is generated at node N2 after the first signal at node N1 passes through the inverter 1121, wherein the second signal is fed back to node N1 via the tristate inverter 1123 and the resistor R1. It should be noted that the control signal En_c and inverted control signal En_t of the tristate inverter 1123 is generated the control enable signal ENext_t from the input-receiver circuit 200 via the signal-generating circuit 250 (shown in FIG. 2C).

Figure 2A:
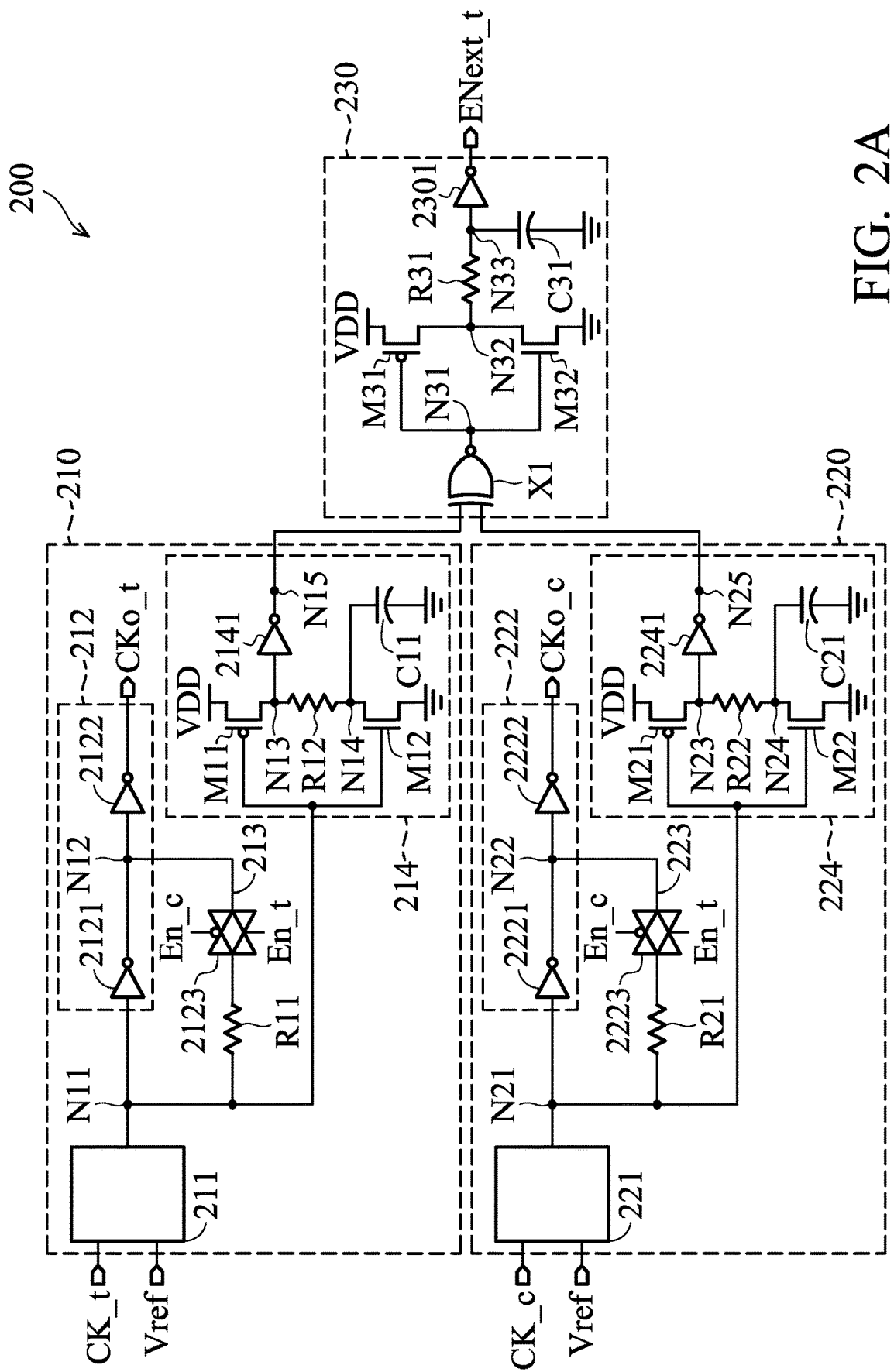
FIG. 2A is a diagram of an input-receiver circuit in accordance with an embodiment of the invention.
Figure 2B:
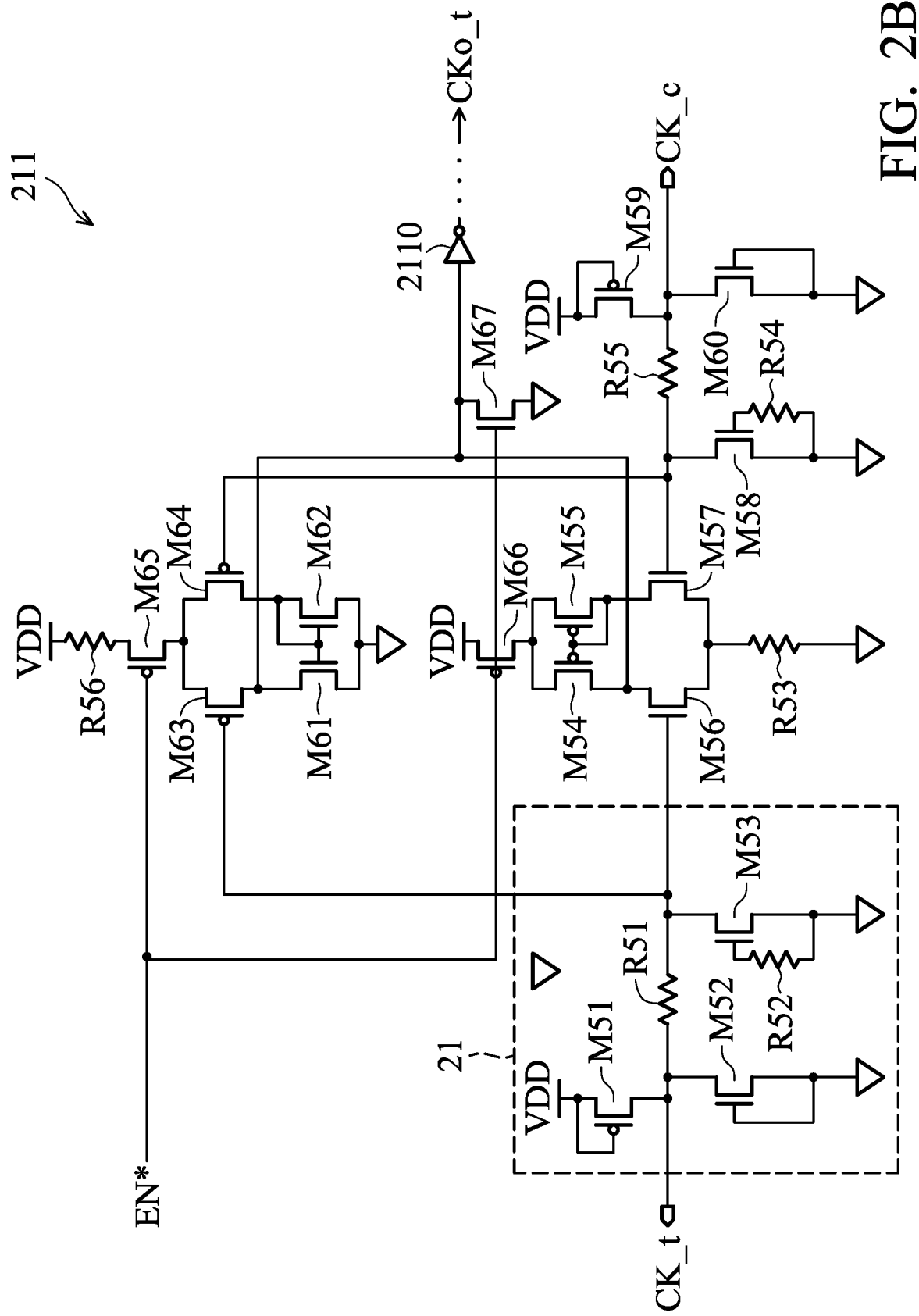
FIG. 2B is a diagram of the differential amplifier in accordance with the embodiment of FIG. 2A.
Figure 2C:
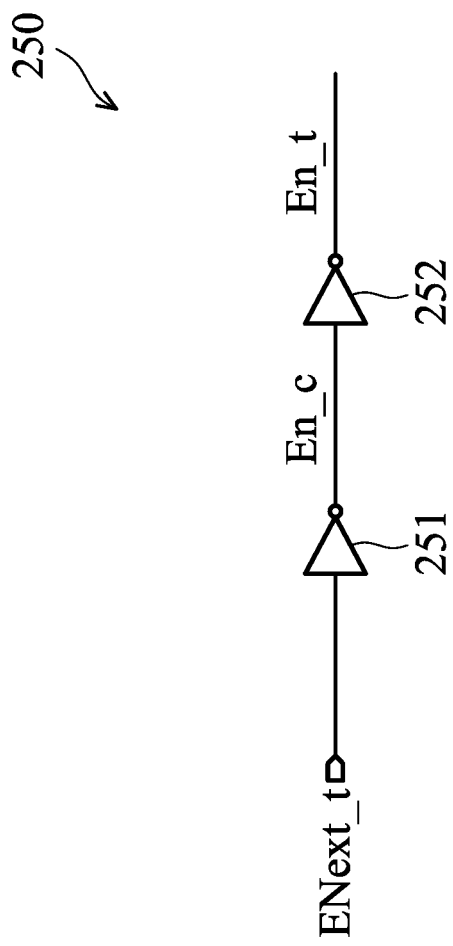
FIG. 2C is a diagram of a signal-generating circuit in accordance with an embodiment of the invention.

FIG. 2A is a diagram of an input-receiver circuit in accordance with an embodiment of the invention. FIG. 2B is a diagram of the differential amplifier in accordance with the embodiment of FIG. 2A. FIG. 2C is a diagram of a signal-generating circuit in accordance with an embodiment of the invention.

As depicted in FIG. 2A, the input-receiver circuit 200 includes input receivers 210 and 220, and a control-signal-output stage 230.

The input receiver 210 includes a differential amplifier 211, a buffer circuit 212, and a delay circuit 214. For example, the differential amplifier 211 may be a wide-swing differential amplifier. The differential amplifier has a clock signal CK_t and a reference voltage Vref as input signals, and outputs a first clock signal at node N11. For example, the differential amplifier 211 can be implemented by the circuit shown in FIG. 2B, that includes MOSFETs M51~M67, resistors R51~R56, and inverters 2110. The MOSFETs M51~M53 and the resistors R51~R52 forms an electrostatic-discharge (ESD) protection circuit, and the inputs of the MOSFETs M56 and M57 are the clock signal CK_t and the inverted clock signal CK_c, respectively.

It should be noted that the circuit of the differential amplifier 221 is the same as that of the differential amplifier 211, and the difference between the differential amplifiers 221 and 211 is that the MOSFETs M56 and M57 in the differential amplifier 221 receive the inverted clock signal CK_c and the reference voltage Vref, respectively. The enable signal EN*, for example, may be the clock enable signal CKE. One having ordinary skill in the art will appreciate the operations of the wide-swing differential amplifier in FIG. 2B, and the details are omitted here.

The buffer circuit 212 includes inverters 2121 and 2122, and the buffer circuit 212 outputs the output clock signal CKo_t at its output terminal after the first clock signal at node N11 passes through the inverters 2121 and 2122.

It should be noted that there is a feedback path (or a feedback circuit) 213 between the differential amplifier 211 and the buffer circuit 212, wherein the feedback path 213 includes a tristate inverter 2123 and resistor R11.

For example, a second clock signal is generated at node N12 after the first clock signal at node N11 passes through the inverter 2121, wherein the second signal is fed back to node N11 via the tristate inverter 2123 and the resistor R11. The tristate inverter 2123 is controlled by the control signals EN_c and EN_t. For example, the control signals EN_c and EN_t are generated by the enable control signal ENext_t. For example, the control signals EN_c and EN_T are generated by the enable control signal ENext_t using the signal-generating circuit 250 show in FIG. 2C, wherein the control signal EN_c is the output signal of the inverter 251 and the control signal EN_t is the output signal of the inverter 252 having the control signal EN_c as the input. In some embodiments, the signal-generating circuit 250 in FIG. 2C can be integrated into the input-receiver circuit 200.

It should be noted that the tristate inverter 2123 is activated in response to the control signal EN_c being at a low logic state and the control signal EN_t being at a high logic state. The tristate inverter 2123 is deactivated (e.g., at a high-impedance state) in response to the control signal En_c being at the high logic state and the control signal EN_t being at the low logic state, and the tristate inverter 2123 can be regarded as being open-circuited at this time.

In addition to control the activation and deactivation of the tristate inverters 2123 and 2223, the control signals EN_c and EN_t generated by the signal-generating circuit 250 are provided to the tristate inverter 1123 in each of the input-receiver circuits 110 of the memory device 100 to control the activation and deactivation thereof. Specifically, the activation or deactivation of the feedback paths in the input-receiver circuits 110 and the input-receiver circuit 200 are simultaneously controlled by the enable control signal ENext_t generated by the input-receiver circuit 200.

The delay circuit 214 may delay the first clock signal at node N11 with an RC delay to generate a first delayed signal at node N15 that is sent to the control-signal output stage 230. The delay circuit 224 may delay the second clock signal at node N21 with the same RC delay to generate a second delayed signal at node N25 that is sent to the control-signal output stage 230. The delay circuit 214 includes a P-type MOSFET M11, an N-type MOSFET M12, a resistor R12, a capacitor C11, and an inverter 2141.

For example, when the first clock signal at node N11 is at the low logic state, the N-type MOSFET M12 is deactivated (i.e., open-circuited), and node N13 is at the high logic state, and node N15 is at the low logic state at the output terminal of the inverter 2141. Meanwhile, the voltage source VDD charges the capacitor C11 through the resistor R12.

When the first clock signal at node N11 is at the high logic state, the N-type MOSFET M12 is activated, and node N13 and node N13 are at the low logic state, and node N15 is at the high logic state at the output terminal of the inverter 2141. Meanwhile, the capacitor C11 is discharged through the N-type MOSFET M12.

In addition, the operations of the components in the input-receiver circuit 220 are similar to those of the components in the input-receiver circuit 210, and the difference between the input-receiver circuits 210 and 220 is that the input-receiver circuit 210 receives the clock signal CK_t and the input-receiver circuit 220 receives the inverted clock signal CK_c, and thus the details will be omitted here.

The control-signal output stage 230 includes an XNOR gate X1, a P-type MOSFET M31, an N-type MOSFET M32, a resistor R31, a capacitor C31, and an inverter 2301.

The inputs of the XNOR gate X1 are the first delayed signal at node N15 generated by the delay circuit 214 of the input-receiver circuit 210, and the second delay signal at node N25 generated by the delay circuit 224 of the input-receiver circuit 220. An operation signal is generated at the output terminal (node N31) of the XNOR gate X1 using the first delayed signal the second delay signal as inputs. Thus, an inverted operation signal is obtained at node N31 by the CMOS inverter including the P-type MOSFET M31 and the N-type MOSFET M32 using the operation signal as an input. The enable control signal ENext_t is obtained at the output terminal of the inverter 2301 after the inverted operation signal at node N32 passes through the RC delay circuit (e.g., including the resistor R31 and capacitor C31) and the inverter 2301.

For example, when the output signal at node N31 generated by the XNOR gate X1 is at the low logic state, the P-type MOSFET M31 is activated. Thus, node N32 is at the high logic state, and the capacitor C31 is charged by the voltage at node N32 through the resistor R31. As a result, node N33 is at the low logic state, and the enable control signal ENext_t being at the high logic state is obtained at the output terminal of the inverter 2301. It should be noted that the operations of the RC-delay circuit in the aforementioned embodiment is performed in the steady state.

In an embodiment, the enable control signal _ output by the input-receiver circuit 200 may control activation and deactivation of the feedback paths (e.g., feedback paths 213 and 223) in the input-receiver circuits 200 and the feedback path (e.g., the feedback paths 113 in FIG. 1B) in each input-receiver circuit 110 of the memory device 100.

In an embodiment, using the input receiver 210 as an example, assume that the input clock signal CK_t of the input receiver 210 has a very high frequency (e.g., 400 MHz, not limited), the capacitor C11 in the delay circuit 214 cannot be fully discharged in time due to fast transitions of the logic state at node N11, and thus node N13 is kept at the high logic state. Similarly, the input inverted clock signal CK_c of the input-receiver 220 also has a very high frequency, and the capacitor C21 in the delay circuit 224 cannot be fully discharged in time either, and thus node N23 is kept at the high logic state.

Meanwhile, nodes N15 and N25 are at the low logic state, and the output of the XNOR gate X1 is at the high logic state, resulting in the N-type MOSFET M32 being activated and the capacitor C31 being fully discharged through the resistor R31. Accordingly, node N33 is at the low logic state, and the enable control signal ENext_t generated by the inverter 2301 is at the high logic state. That is, the tristate inverter in each input-receiver circuit is activated, and thus the feedback path is turned on.

In an embodiment, using the input receiver 210 as an example, assume that the input clock signal CK_t of the input receiver 210 has a very low frequency (e.g., lower than a predetermined frequency such as 50 MHz) and a normal slew rate (e.g., higher than a predetermined slew rate). If the clock signal CK_t is at the low logic state, node N11 is also at the low logic state, resulting in the P-type MOSFET M11 in the delay circuit 214 being activated. Accordingly, node N13 is at the high logic state, and node N15 is at the high logic state via the inverter 2141.

Meanwhile, the input inverted clock signal CK_c of the input receiver 220 is at the high logic state, and node N21 is also at the high logic state, resulting in the N-type MOSFET M22 in the delay circuit 224 being activated to fully discharge the capacitor C21. Accordingly, node N23 is at the low logic state, and node N25 is at the low logic state via the inverter 2241.

Thus, the output of the XNOR gate X1 at node 1 is at the low logic state, and the P-type MOSFET M31 is activated, and node N32 is at the high logic state to charge the capacitor C31. That is, node N33 is at the high logic state, and the enable control signal ENext_t generated by the inverter 2301 is at the low logic state. As a result, the tristate inverters in the input-receiver circuits 110 and 200 are turned off (i.e., at the high-impedance state), and the feedback paths are cut off.

Similarly, in the embodiment, if the clock signal CK_t is at the low logic state and the inverted clock signal CK_c is at the high logic state, the output of the XNOR gate X1 at node 31 is also at the low logic state. Meanwhile, the P-type MOSFET M31 is activated, and node N32 is at the high logic state to charge the capacitor C31. That is, node N33 is at the high logic state, and the enable control signal ENext_t generated by the inverter 2301 is at the low logic state. As a result, the tristate inverters in the input-receiver circuits 110 and 200 are turned off (i.e., at the high-impedance state), and the feedback paths are cut off.

Therefore, when the clock signal and the inverted clock signal have a very low frequency and a normal slew rate, the enable control signal ENext_t is at the low logic state, and thus the feedback path in each input-receiver circuit is cut off.

In an embodiment, when the memory device 100 enters a power-saving mode, the clock signal CK_t is stopped (e.g., the clock enable signal CKE in FIG. 1A is at the low logic state), and the clock signal CK_t is kept at the low logic state, and the inverted clock signal CK_c is kept at the high logic state. Accordingly, one having ordinary skill in the art will appreciate that node N15 is at the high logic state and node N25 is at the low logic state using a manner that is similar to the one described in the aforementioned embodiment. Thus, the output of the XNOR gate X1 at node N31 is at the low logic state, such that the P-type MOSFET M31 is activated and the node N32 is at the high logic state to charge the capacitor C31. That is, node N33 is at the high logic state, and the enable control signal ENext_t generated by the inverter 2301 is at the low logic state. As a result, the tristate inverters in the input-receiver circuits 110 and 200 are turned off (i.e., at the high-impedance state), and the feedback paths are cut off.

In an embodiment, the RC delays for the delay circuits 214 and 224 are designed to match each other. If the memory device 100 is operated at a frequency of 400 MHz, the period tCK of the clock signal is 2.5 ns. Meanwhile, the RC delay can be designed to be 1.25 ns, where the resistance R (e.g., the resistors R12 and R22) is 2KΩ, and the capacitance C (e.g., the capacitors C11 and C21) is 625 fF, but the invention is not limited to the aforementioned values.

Generally, if the frequency of the clock signal is high enough, the slew rate of the clock signal is not too low. A clock signal having a lower frequency may have a lower slew rate. For example, the threshold of the RC delay may be designed using a clock signal having a predetermined frequency and a high enough slew rate that oscillation of the circuits will not be caused in the next stage, and the performance of the input-receiver circuits will not be affected even if the feedback path is activated or deactivated. Although the logic state of the enable control signal ENext_t may temporarily vary due to the RC delay of the control-signal output stage 230, the operation of the input-receiver circuit 200 will not be affected.

Figure 3:
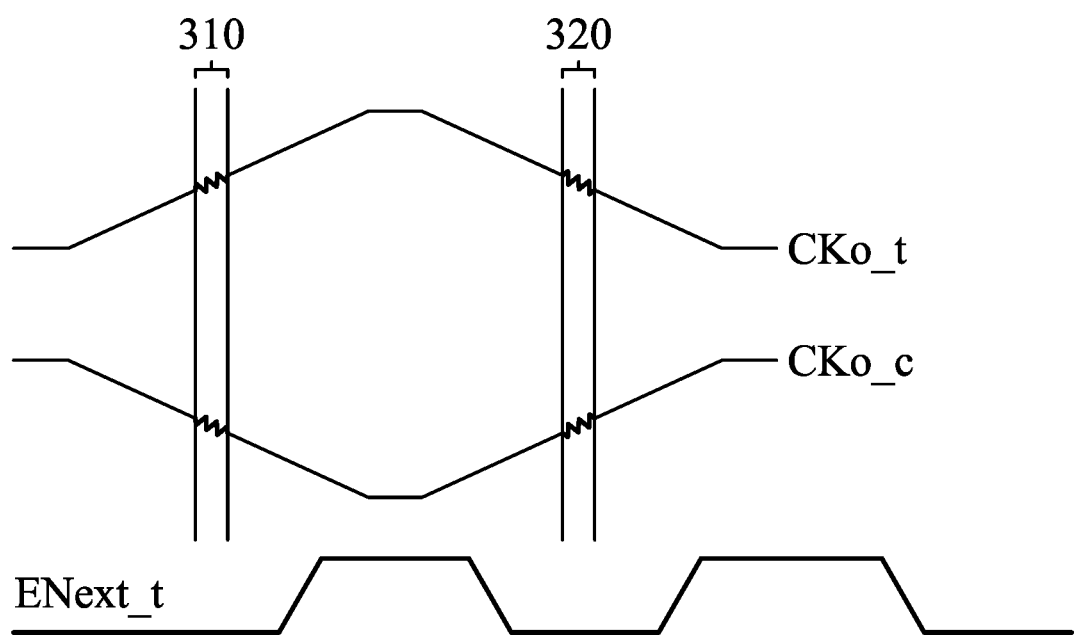
FIG. 3 is a timing diagram of the enable control signal in accordance with an embodiment of the invention.

FIG. 3 is a timing diagram of the enable control signal in accordance with an embodiment of the invention. In the aforementioned embodiment, when the clock signal and the inverted clock signal have a low frequency and a normal slew rate, the enable control signal ENext_t is at the low logic state, and the feedback path in each input-receiver circuits 110 and 200 is cut off.

In an embodiment, assume that the input clock signal CK_t and the inverted clock signal CK_c of the input receivers 210 and 220 have a very low frequency (e.g., lower than a predetermined frequency such as 50 MHz) and the slew rate thereof is lower than a predetermined slew rate. In the embodiment, since the slew rate of the input clock signal CK_t is very low and the control-signal output stage 230 has an RC delay, the enable control signal ENext_t cannot be kept at the low logic state.

For example, as depicted in FIG. 3, when the output clock signal CKo_t is at the rising edge, the voltage of the output clock signal CKo_t may oscillate due to the feedback path during the rising edge of the output clock signal CKo_t, such as the output clock signal CKo_t oscillating within range 310. Similarly, when the output clock signal CKo_t is at the falling edge, the voltage of the output clock signal CKo_t may oscillate due to the feedback path during the falling edge of the output clock signal CKo_t, such as the output clock signal CKo_t oscillating within range 320. In a similar manner, the inverted clock signal CKo_c may oscillate at the rising edge and the falling edge.

With the RC delay of the control-signal output stage 230, the enable control signal ENext_t is temporarily switched to the high logic state from the low logic state in response to the output clock signal CKo_t being at the high logic state (or the inverted clock signal CKo_c being at the low logic state). However, since the memory device 100 is a digital circuit, the latch operations of its command, address, and data is performed at the rising edge or the falling edge of the output clock signal CKo_t or the output inverted clock signal CKo_c.

Specifically, when the enable control signal ENext_t is temporarily switched to the high logic state from the low logic state, the temporary logic state variation of the enable control signal ENext_t does not occur at the rising edge or the falling edge of the output clock signal CKo_t or the output inverted clock signal CKo_c. Accordingly, the back-end circuits will not latch the command, address, and data at the temporary high logic state of the enable control signal ENext_t, and thus the operation of the memory device 100 will not be affected.

Figure 4:
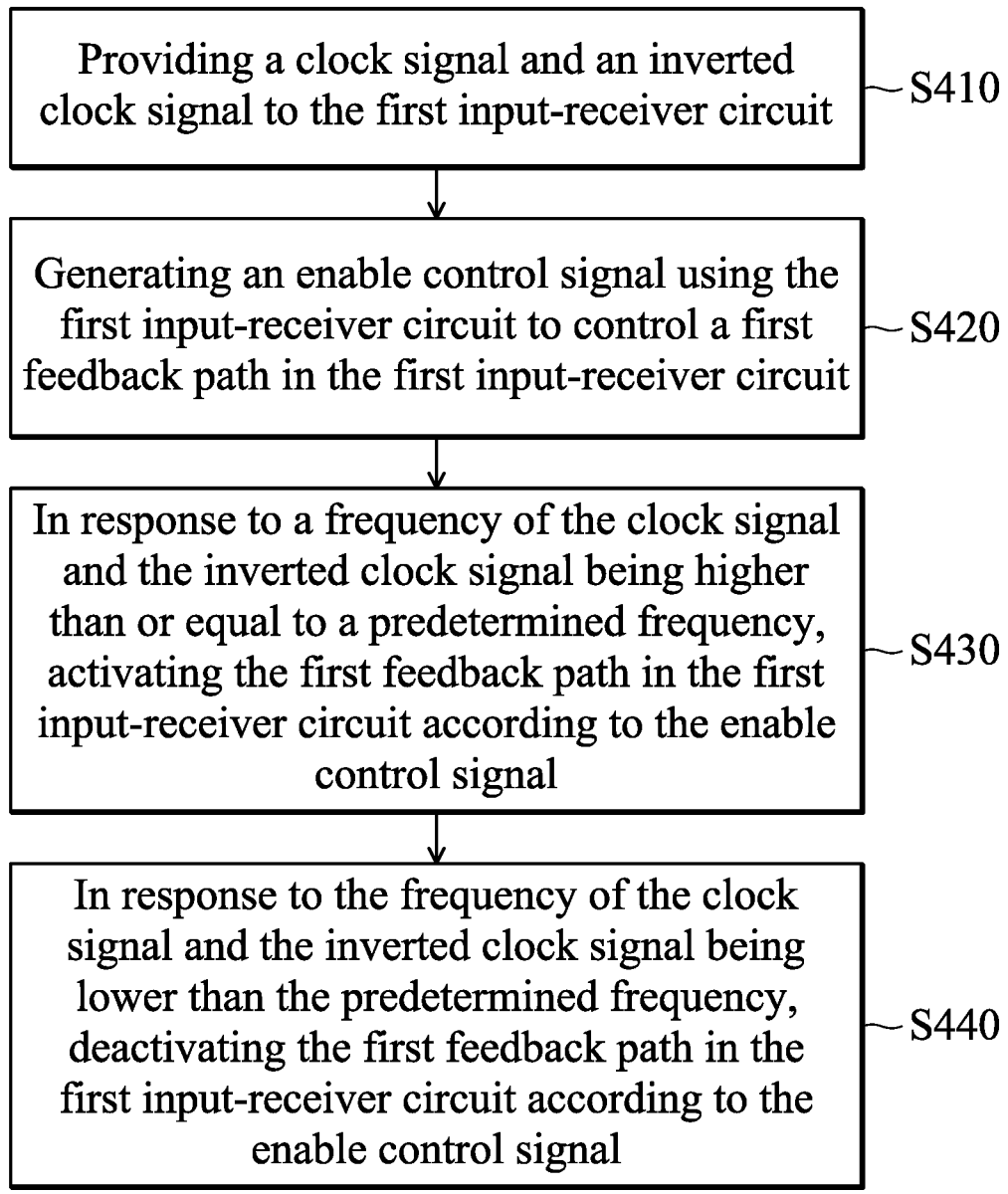
FIG. 4 is a flow chart of an adaptive feedback method in accordance with an embodiment of the invention.

FIG. 4 is a flow chart of an adaptive feedback method in accordance with an embodiment of the invention.

Referring to FIG. 4 and FIG. 2A, in step S410, a clock signal and an inverted clock signal are provided to a first input-receiver circuit. For example, the first input-receiver circuit may be the input-receiver circuit 200.

In step S420, an enable control signal is generated using the first input-receiver circuit to control a feedback path within the first input-receiver circuit. For example, the input-receiver circuit 200 includes the input receivers 210 and 220 that respectively receive the output signals of the differential amplifiers 211 and 221 via the delay circuits 214 and 224, and generate the first delayed signal and the second delayed signal using the RC delay. The first delayed signal and the second delayed signal are transmitted to the control-signal output stage 230. Then, the first delayed signal and the second delayed signal are fed into the XNOR gate, and the RC delay is applied to the output signal of the XNOR gate to generate the enable control signal ENext_t. For example, the control signals EN_c and EN_t can be generated by the signal-generating circuit 250 in FIG. 2C using the enable control signal ENext_t as an input signal.

In step S430, in response to a frequency of the clock signal and the inverted clock signal being higher than or equal to a predetermined frequency, the enable control signal activates feedback paths of the first input-receiver circuit and each of the second input-receiver circuits.

In step S440, in response to the frequency of the clock signal and the inverted clock signal being lower than the predetermined frequency, the enable control signal deactivates the feedback paths of the first input-receiver circuit and each of the second input-receiver circuits.

In view of the above, an input-receiver circuit and an adaptive feedback method are provided in the present invention. The input-receiver circuit and the adaptive feedback method are capable of generating an enable control signal by the delayed signals generated from a clock signal and an inverted clock signal via logic operations and appropriate RC delays. In response to the frequency of the clock signal and the inverted clock signal being higher than or equal to a predetermined frequency, the feedback paths in the input-receiver circuit 200 and input-receiver circuits 110 in the memory device 100 are activated according to the enable control signal. In response to the frequency of the clock signal and the inverted clock signal being lower than the predetermined frequency, the feedback paths in the input-receiver circuit 200 and input-receiver circuits 110 are deactivated (i.e., cut off), such that the backend device (e.g., the memory device) will not latch corresponding input signals during the period of oscillation of the clock signal having a low frequency, thereby ensuring normal operations of the memory device.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An input-receiver circuit, comprising:
    a first input receiver, comprising:
        a first differential amplifier, configured to receive a clock signal and output an amplified clock signal;
        a first buffer circuit, configured to buffer the amplified clock signal and output an output clock signal, wherein there is a first feedback path between the first buffer circuit and the first differential amplifier; and
        a first delay circuit, configured to add a time delay on the amplified clock signal to generate a first delayed signal;
    a second input receiver, comprising:
        a second differential amplifier, configured to receive an inverted clock signal and output an amplified inverted clock signal;
        a second buffer circuit, configured to buffer the amplified inverted clock signal and output an output inverted clock signal, wherein there is a second feedback path between the second buffer circuit and the second differential amplifier; and
        a second delay circuit, configured to add the time delay on the amplified inverted clock signal to generate a second delayed signal;
    a control-signal output stage, configured to generate an enable control signal according to the first delayed signal and the second delayed signal, wherein the enable control signal controls activation and deactivation of the first feedback path and the second feedback path.

2. The input-receiver circuit as claimed in claim 1, wherein the first differential amplifier and the second differential amplifier are wide-swing differential amplifiers.

3. The input-receiver circuit as claimed in claim 1, wherein the first buffer circuit comprises a first inverter and a second inverter that are connected in series, and an output terminal of the first inverter is electrically connected to an output terminal of the first differential amplifier through a first tristate inverter and a first resistor to form the first feedback path,
    wherein the second buffer comprises a third inverter and a fourth inverter that are connected in serial, and an output terminal of the third inverter is electrically connected to an output of the second differential amplifier through a second tristate inverter and a second resistor to form the second feedback path.

4. The input-receiver circuit as claimed in claim 1, wherein the control-signal output stage comprises: an XNOR gate, a third delay circuit, and an inverter, wherein the XNOR gate receives the first delayed signal and the second delayed signal to generate an operation signal, and the operation signal passes through the third delay circuit and the inverter to generate the enable control signal.

5. The input-receiver circuit as claimed in claim 3, further comprising:
    a signal-generating circuit, configured to convert the enable control signal to a control signal and an inverted control signal, and activation and deactivation of the first tristate inverter and the second tristate inverter are controlled by the control signal and the inverted control signal.

6. The input-receiver circuit as claimed in claim 5, wherein the signal-generating circuit comprises a fifth inverter and a sixth inverter, and the fifth inverter receives the enable control signal to generate the control signal at an output terminal of the fifth inverter, and the sixth inverter receives the control signal to generate the inverted control signal at an output terminal of the sixth inverter.

7. The input-receiver circuit as claimed in claim 5, wherein in response to the enable control signal being at a high logic state, the control signal is at a low logic state and the inverted control signal is at the high logic state to activate the first tristate inverter and the second tristate inverter to activate the first feedback path and the second feedback path,
    wherein in response to the enable control signal being at the low logic state, the control signal is at the high logic state and the inverted control signal is at the low logic state to deactivate the first tristate inverter and the second tristate inverter to deactivate the first feedback path and the second feedback path.

8. The input-receiver circuit as claimed in claim 1, wherein in response to a frequency of the clock signal and the inverted clock signal being higher than or equal to a predetermined frequency, the enable control signal is at a high logic state,
    wherein in response to the frequency of the clock signal and the inverted clock signal being lower than the predetermined frequency, the enable control signal is at a low logic state.

9. The input-receiver circuit as claimed in claim 1, wherein the input-receiver circuit is disposed in a memory device, and each bit signal of a command signal, an address signal, and a data signal received by the memory device has a corresponding third input receiver, and the third input receiver comprises:
    a third differential amplifier, configured to receive the corresponding bit signal and output an amplified bit signal; and
    a third buffer circuit, configured to buffer the amplified bit signal and output an output bit signal, wherein there is a third feedback path between the third buffer circuit and the third differential amplifier,
    wherein the enable control signal controls activation and deactivation of the third feedback path in the third input receiver corresponding to each bit signal.

10. An adaptive feedback method for use in a memory device, wherein the memory device comprises a first input-receiver circuit and a plurality of second input-receiver circuits, the method comprising:
    providing a clock signal and an inverted clock signal to the first input-receiver circuit;

generating an enable control signal using the first input-receiver circuit to control a first feedback path in the first input-receiver circuit;

in response to a frequency of the clock signal and the inverted clock signal being higher than or equal to a predetermined frequency, activating the first feedback path in the first input-receiver circuit according to the enable control signal; and in response to the frequency of the clock signal and the inverted clock signal being lower than the predetermined frequency, deactivating the first feedback path in the first input-receiver circuit according to the enable control signal.

11. The adaptive feedback method as claimed in claim 10, wherein each of the second input-receiver circuits corresponds to each bit signal of a command signal, an address signal, and a data signal received by the memory device, and activation and deactivation of a second feedback path in each of the second input-receiver circuits is controlled by the enable control signal.

* * * * *